(12) United States Patent
Forbes

(10) Patent No.: US 7,084,429 B2
(45) Date of Patent: Aug. 1, 2006

(54) STRAINED SEMICONDUCTOR BY WAFER BONDING WITH MISORIENTATION

(75) Inventor: Leonard Forbes, Corvallis, OR (US)

(73) Assignee: Micron, Technology, Inc., Boise, ID (US)

( * ) Notice: Subject to any disclaimer, the term of this patent is extended or adjusted under 35 U.S.C. 154(b) by 123 days.

(21) Appl. No.: 10/931,749

(22) Filed: Aug. 31, 2004

(65) Prior Publication Data
US 2005/0023529 A1 Feb. 3, 2005

Related U.S. Application Data

(62) Division of application No. 10/425,484, filed on Apr. 29, 2003.

(51) Int. Cl.
*H01L 29/76* (2006.01)
(52) U.S. Cl. .......................... 257/66; 257/213; 257/590
(58) Field of Classification Search ................. 257/66, 257/213, 590
See application file for complete search history.

(56) References Cited

U.S. PATENT DOCUMENTS

| | | | |
|---|---|---|---|
| 5,234,535 A | 8/1993 | Beyer et al. |
| 5,441,591 A | 8/1995 | Imthurn et al. |
| 5,461,243 A | 10/1995 | Ek et al. |
| 5,759,898 A | 6/1998 | Ek et al. |
| 5,854,501 A | 12/1998 | Kao |
| 5,879,996 A | 3/1999 | Forbes |
| 5,963,817 A | 10/1999 | Chu et al. |
| 6,103,598 A | 8/2000 | Yamagata et al. |
| 6,136,666 A | 10/2000 | So |
| 6,143,628 A | 11/2000 | Sato et al. |
| 6,228,694 B1 | 5/2001 | Doyle et al. |
| 6,251,751 B1 | 6/2001 | Chu et al. |
| 6,423,613 B1 | 7/2002 | Geusic |
| 6,514,836 B1 | 2/2003 | Belford |
| 6,515,335 B1 | 2/2003 | Christiansen et al. |
| 6,583,437 B1 | 6/2003 | Mizuno et al. |
| 6,593,625 B1 | 7/2003 | Christiansen et al. |
| 6,630,713 B1 | 10/2003 | Geusic |

(Continued)

FOREIGN PATENT DOCUMENTS

JP 54-155770 A 12/1979

OTHER PUBLICATIONS

"Cornell Demonstrates a Universal Substrate", *Compound Semiconductor, 3(2)*, (Mar./Apr. 1997), 27-29.

(Continued)

*Primary Examiner*—Fetsum Abraham
(74) *Attorney, Agent, or Firm*—Schwegman, Lundberg, Woessner & Kluth, P.A.

(57) ABSTRACT

One aspect of the present invention relates to a method for forming a strained semiconductor structure. In various embodiments, at least two strong bonding regions are defined for a desired bond between a crystalline semiconductor membrane and a crystalline semiconductor substrate. The two strong bonding regions are separated by a weak bonding region. The membrane is bonded to the substrate at a predetermined misorientation. The membrane is pinned to the substrate in the strong bonding regions. The predetermined misorientation provides the membrane in the weak bonding region with a desired strain. In various embodiments, the membrane is bonded to the substrate at a predetermined twist angle to biaxially strain the membrane in the weak bonding region. In various embodiments, the membrane is bonded to the substrate at a predetermined tilt angle to uniaxially strain the membrane in the weak bonding region. Other aspects are provided herein.

33 Claims, 10 Drawing Sheets

U.S. PATENT DOCUMENTS

| | | |
|---|---|---|
| 6,649,492 B1 | 11/2003 | Chu et al. |
| 6,689,671 B1 | 2/2004 | Yu et al. |
| 6,703,293 B1 | 3/2004 | Tweet et al. |
| 6,703,648 B1 | 3/2004 | Xiang et al. |
| 6,740,913 B1 | 5/2004 | Doyle et al. |
| 6,812,508 B1 | 11/2004 | Fukumi |
| 2002/0185686 A1 | 12/2002 | Christiansen et al. |
| 2003/0013323 A1 | 1/2003 | Hammond et al. |
| 2003/0201469 A1 | 10/2003 | Christiansen et al. |
| 2003/0218189 A1 | 11/2003 | Christiansen et al. |
| 2004/0173798 A1 | 9/2004 | Forbes |
| 2004/0214366 A1 | 10/2004 | Segal et al. |
| 2004/0217391 A1 | 11/2004 | Forbes |
| 2004/0224480 A1 | 11/2004 | Forbes |
| 2004/0232422 A1 | 11/2004 | Forbes |
| 2004/0232487 A1 | 11/2004 | Forbes |
| 2004/0232488 A1 | 11/2004 | Forbes |
| 2005/0020094 A1 | 1/2005 | Forbes et al. |
| 2005/0023612 A1 | 2/2005 | Forbes |
| 2005/0023616 A1 | 2/2005 | Forbes |
| 2005/0029619 A1 | 2/2005 | Forbes |
| 2005/0032296 A1 | 2/2005 | Forbes |

OTHER PUBLICATIONS

Abe, T , "Silicon Wafer-Bonding Process Technology for SOI Structures", *Extended Abstracts of the 22nd (1990 International) Conference on Solid State Devices and Materials*, (1990), 853-856.

Auberton-Herve, A J., "SOI: Materials to Systems", *International Electron Devices Meeting. Technical Digest*, (1996), 3-10.

Autumn, Kellar , et al., "Adhesive force of a single gecko foot-hair", *Nature*, 405(6787), (Jun. 2000) ,681-685.

Autumn, Kellar , et al., "Evidence for van der Waals adhesion in gecko setae.", *Proceedings of the National Academy of Science U S A.;* 99(19), (Sep. 17, 2002), 12252-6.

Belford, Rona E., et al., "Performance-Augmented CMOS Using Back-End Uniaxial Strain", *IEEE 60th DRC. Conference Digest Device Research Conference*, 2002, (Jun. 24-26, 2002), 41-42.

Berti, M. , "Composition and Structure of Si-Ge Layers Produced by Ion Implantation and Laser Melting", *Journal of Materials Research*, 6(10), (Oct. 1991), 2120-2126.

Berti, M. , "Laser Induced Epitaxial Regrowth of Si[sub 1-x]Ge[sub x]/Si Layers Produced by Ge Ion Implantation", *Applied Surface Science*, 43, (1989), 158-164.

Biever, Celeste , "Secret of 'strained silicon' revealed: behind closed doors, Intel has perfected a novel way to improve chip performance.", *New Scientist*, 180(i2426-2428), (Dec. 20, 2003), 27.

Chilton, B T., et al., "Solid phase epitaxial regrowth of strained Si(1-x)Ge(x)/Si strained layer structures amorphized by ion implantation", *Applied Physics Letters*, 54(1), (Jan. 2, 1989), 42-44.

Dharmatilleke, S N., et al., "Anodic Bonding of Glass to Glass and Silicon to Glass or Silicon to Silicon Through a Very Thick Thermally Grown SiO2 Layer", *Proceedings of IS 3M International Symposium on Smart Structures and Microsystems*, http://dolphin.eng.uc.edu/projects/bonding/paper.pdf, (2000), 32.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998), 13-17.

Fischetti, M V., et al., "Band structure, deformation potentials, and carrier mobility in strained Si, Ge, and SiGe alloys", *Journal of Applied Physics*, 80(4), (Aug. 15 1996), 2234-2252.

Garcia, G A., et al., "High-quality CMOS in thin (100 nm) silicon on sapphire", *IEEE Electron Device Letters*, 9(1), (Jan. 1988), 32-34.

Harendt, Christine , "Silicon on Insulator Material by Wafer Bonding", *Journal of Electronic Materials*, 20(3), (Mar. 1991), 267-77.

Imthurn, George P., et al., "Bonded Silicon-on-Sapphire Wafers and Devices", *Journal of Applied Physics*, 72(6), (Sep. 1992), 2526-7.

Lasky, J. B., "Wafer Bonding for Silicon-on-Insulator Technologies", *Applied Physics Letters*, 48(1), (Jan. 6, 1986), 78-80.

Lu, D, , "Bonding Silicon Wafers by Use of Electrostatic Fields Followed by Rapid Thermal Heating", *Materials Letters* 4(11), (Oct. 1986), 461-464.

Mizuno, T , et al., "Advanced SOI-MOSFETs with Strained-Si Channel for High Speed CMOS Electron/Hole Mobility Enhancement", *2000 Symposium on VLSI Technology. Digest of Technical Papers,*, (2000), 210-211.

O'Neill, A G., et al., "High speed deep sub-micron MOSFET using high mobility strained silicon channel", *ESSDERC '95. Proceedings of the 25th European Solid State Device Research Conference*, (Sep. 1995), 109-12.

Omi, Hiroo , et al., "Semiconductor Surface with Strain Control", http://www.brl.ntt.co.jp/J/kouhou/katsudou/report00/E/report04_e.html.

Paine, D. C., "The Growth of Strained Si-xGex Alloys on (100) Silicon Using Solid Phase Epitaxy", *Journal of Materials Research*, 5 (5), (May 1990), 1023-1031.

People, R. , "Calculation of critical layer thickness versus lattice mismatch for GexSi1-x/Si strained-layer heterostructures", *Applied Physics Letters*, 47 (3), (Aug. 1, 1985), 322-4.

Rim, Kern , et al., "Fabrication and analysis of deep submicron strained-Si n-MOSFET's", *IEEE Transactions on Electron Devices*, 47(7), (Jul. 2000), 1406-1415.

Rim, Kern , et al., "Strained Si NMOSFETs for High Performance CMOS Technology", *2001 Symposium on VLSI Technology. Digest of Technical Papers*, (2001), 59-60.

Rim, Kern , et al., "Transconductance enhancement in deep submicron strained Si n-MOSFETs", *International Electron Devices Meeting 1998. Technical Digest*, (1998), 707-710.

Sugiyama, N , et al., "Formation of strained-silicon layer on thin relaxed-SiGe/SiO/sub 2//Si structure using SIMOX technology", *Thin Solid Films*, 369(1-2), (Jul. 2000), 199-202.

Takagi, Shin-Ichi , "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002), 37-40.

Welser, J , et al., "Strain dependence of the performance enhancement in strained-Si n-MOSFETs", *IEEE International Electron Devices Meeting 1994. Technical Digest*, (Dec. 11-14, 1994), 373-376.

STRAINED SEMICONDUCTOR BY WAFER BONDING WITH MISORIENTATION

CROSS REFERENCE TO RELATED APPLICATIONS

This application is a divisional under 37 C.F.R. 1.53(b) of U.S. Ser. No. 10/425,484, filed Apr. 29, 2003, which application is incorporated herein by reference.

This application is also related to the following commonly assigned U.S. patent applications which are herein incorporated by reference in their entirety:

"Output Prediction Logic Circuits With Ultra-Thin Vertical Transistors and Methods of Formation," U.S. application Ser. No. 10/164,611, filed on Jun. 10, 2002;

"Micro-Mechanically Strained Semiconductor Film," U.S. application Ser. No. 10/379,749, filed on Mar. 5, 2003;

"Localized Strained Semiconductor on Insulator," U.S. application Ser. No. 10/425,797, filed on Apr. 29, 2003;

"Strained Si/SiGe Layer Structures By Ion Implantation," U.S. application Ser. No. 10/431,134, filed on May 7, 2003;

"Strained Semiconductor by Wafer Bonding with Misorientation," U.S. application Ser. No. 10/425,484, filed on Apr. 29, 2003; and "Micromechanical Strained Silicon By Wafer Bonding," U.S. application Ser. No. 10/431,137, filed on May 7, 2003.

TECHNICAL FIELD

This disclosure relates generally to semiconductor devices, and more particularly, to devices formed with strained semiconductor films.

BACKGROUND

The semiconductor industry continues to strive for improvements in the speed and performance of semiconductor devices. Strained silicon technology enhances carrier mobility in both n-channel and p-channel devices, and thus improves device speed and performance.

One technique for producing strained silicon involves growing silicon on relaxed silicon germanium (Si/SiGe) structures. There is a large mismatch in the cell structure between the Si and SiGe layers. This mismatch causes a pseudomorphic layer of Si on relaxed SiGe to be under a biaxial tensile strain that modifies the band structure and enhances carrier transport in the Si layer. In an electron inversion layer, the subband splitting is larger in strained Si because of the strain-induced band splitting in addition to that provided by quantum confinement. For example, the ground level splitting $(E_0(d_4)-E_0(d_2))$ in a MOS inversion layer at 1 MV/cm transverse field is ~120 meV for unstrained Si and ~250 meV for strained Si. The increase in energy splitting reduces inter-valley scattering and enhances NMOSFET mobility, as demonstrated at low (<0.6 MV/cm) and higher (~1 MV/cm) vertical fields. The scaled transconductance $(g_m)$ is also improved due to the reduced density of states and enhanced non-equilibrium transport.

One method for forming the Si/SiGe layer involves epitaxially growing the Si and SiGe layers using an ultra-high vacuum chemical vapor deposition (UHVCVD) process. The UHVCVD process is a costly and complex process. The Ge content is graded in steps to form a fully relaxed SiGe buffer layer before a thin (~20 nm) strained Si channel layer is grown. X-ray diffraction analysis can be used to quantify the Ge content and strain relaxation in the SiGe layer. The strain state of the Si channel layer can be confirmed by Raman spectroscopy. One proposed back end approach for straining silicon applies uniaxial strain to wafers/dies after the integrated circuit process is complete. The dies are thinned to membrane dimensions and then affixed to curved substrates to apply an in-plane, tensile strain after device manufacture.

Research indicates that uniaxial strained silicon has advantages over biaxial strained silicon. Less strain is required to obtain an improvement factor if the silicon is strained uniaxially rather than biaxially. Uniaxial strained silicon reduces contact potentials, alters the work function, and reduces band gap and in-plane effective mass to improve conduction.

There is a need in the art to provide improved strained semiconductor films and devices that incorporate the strained films, and to provide improved methods for forming strained semiconductor films.

SUMMARY

The above mentioned problems are addressed and will be understood by reading and studying this specification. Strained semiconductor films are disclosed herein. Also disclosed herein are methods of forming the strained semiconductor films along with methods of forming structures and devices that include strained semiconductor films. A relatively simple and low cost wafer bonding technique to produce strained semiconductor layers is described herein. A thin semiconductor layer is bonded to a semiconductor substrate with a desired tilt/twist misorientation designed to produce a desired strain in the thin semiconductor layer. The thickness of the thin semiconductor layer is sufficiently small such that the film is capable of being sufficiently strained to enhance carrier mobility before plastic deformation.

Disclosed herein is a method for forming a strained semiconductor structure. In various embodiments, at least two strong bonding regions are defined for a desired bond between a crystalline semiconductor membrane and a crystalline semiconductor substrate. The two strong bonding regions are separated by a weak bonding region. The membrane is bonded to the substrate at a predetermined misorientation. The membrane is pinned to the substrate in the strong bonding regions. The predetermined misorientation provides the membrane in the weak bonding region with a desired strain. In various embodiments, the membrane is bonded to the substrate at a predetermined twist angle to biaxially strain the membrane in the weak bonding region. In various embodiments, the membrane is bonded to the substrate at a predetermined tilt angle to uniaxially strain the membrane in the weak bonding region.

In various embodiments, a crystalline semiconductor membrane is defined in a surface layer of a sacrificial crystalline semiconductor wafer. The surface layer of the sacrificial wafer is bonded to a crystalline semiconductor substrate at a predetermined misorientation. The crystalline membrane is pinned to the crystalline substrate in two or more strong bonding regions that are separated by a weak bonding region. The sacrificial wafer and the substrate are heat-treated. The sacrificial layer is removed from the membrane such that the membrane remains strongly bonded to the substrate at the predetermined misorientation. The crystalline membrane in the weak bonding region has a desired strain attributed to the predetermined misorientation.

Disclosed herein is a strained semiconductor structure. The structure includes a crystalline silicon substrate, and a crystalline silicon membrane strongly bonded to the substrate in at least two predetermined strong bonding regions and weakly bonded to the substrate in a weak bonding region located between the strong bonding regions. The membrane is strained in between the strong bonding regions. The membrane includes a regular array of screw dislocations in the strong bonding regions. In various embodiments, the membrane is bonded to the substrate at a predetermined twist misorientation such that the membrane in the weak bonding region has a biaxial strain. In various embodiments, the membrane is bonded to the substrate at a predetermined tilt misorientation such that the membrane in the weak bonding region has a uniaxial strain.

These and other aspects, embodiments, advantages, and features will become apparent from the following description and the referenced drawings.

DETAILED DESCRIPTION

The following detailed description refers to the accompanying drawings which show, by way of illustration, specific aspects and embodiments in which the present invention may be practiced. The various embodiments of the present invention are not necessarily mutually exclusive as aspects of two or more embodiments can be combined to form other embodiments. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Various embodiments of the present invention provides methods to strain silicon, and structures formed using strained silicon. A crystalline semiconductor membrane is bonded to a crystalline semiconductor substrate at a predetermined misorientation to provide the membrane with a desired strain. Various embodiments mechanically strain a thin silicon layer by bonding the thin silicon layer to a silicon substrate with a desired tilt misorientation to provide the silicon layer with a desired uniaxial strain. Various embodiments mechanically strain a thin silicon layer by bonding the thin silicon layer to a silicon substrate with a desired twist misorientation to provide the silicon layer with a desired biaxial strain. Various embodiments mechanically strain a thin silicon layer by bonding the thin silicon layer to a silicon substrate with a desired tilt and twist misorientation. The silicon layer is sufficiently thin such that it does not plastically deform due to dislocations, yields and/or fractures. One of ordinary skill in the art will understand, upon reading and comprehending this disclosure, that other semiconductor materials can be strained in accordance with this disclosure.

Figure 1:
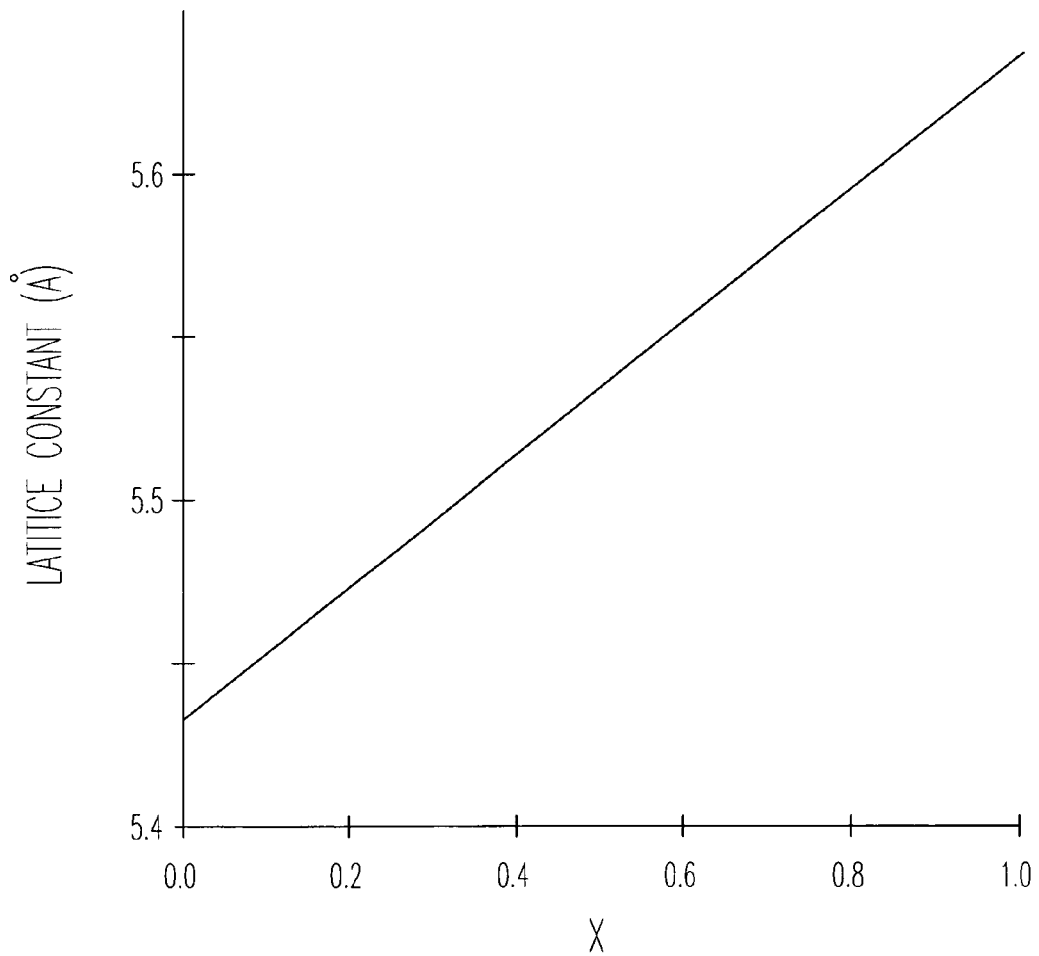
FIG. 1 illustrates a relationship between elastic strain and semiconductor layer thicknesses.

Silicon is intentionally strained with a mechanical strain to enhance carrier mobility. Desirable mechanical strain can be determined using research findings for Si/SiGe structures. Si has a lattice constant of 5.43095 Å, and Ge has a lattice constant of 5.64613 Å. The lattice constant of SiGe is between the lattice constant of Si and the lattice constant of Ge, and depends on the percentage of Ge in the SiGe layer. FIG. 1 illustrates the lattice constant of a $Si_{1-X}Ge_X$ substrate for different percentages (X) of Ge. As indicated by FIG. 1, a $Si_{1-X}Ge_X$ substrate containing about 30% Ge (X≈0.3) has a lattice constant of about 5.50 Å. The biaxial strain of the Si on the SiGe can be calculated as follows:

$$\text{Biaxial\_Strain} = \frac{SiGe_{LC} - Si_{LC}}{Si_{LC}} \quad (1)$$

where the subscript LC represents the lattice constant of the SiGe or Si. Thus, as shown in Equation 2, the Si on the SiGe substrate has a biaxial strain of about 1.28%.

$$\text{Biaxial\_Strain} \approx \frac{5.50 - 5.43}{5.43} = 1.28\%. \qquad (2)$$

Figure 2:
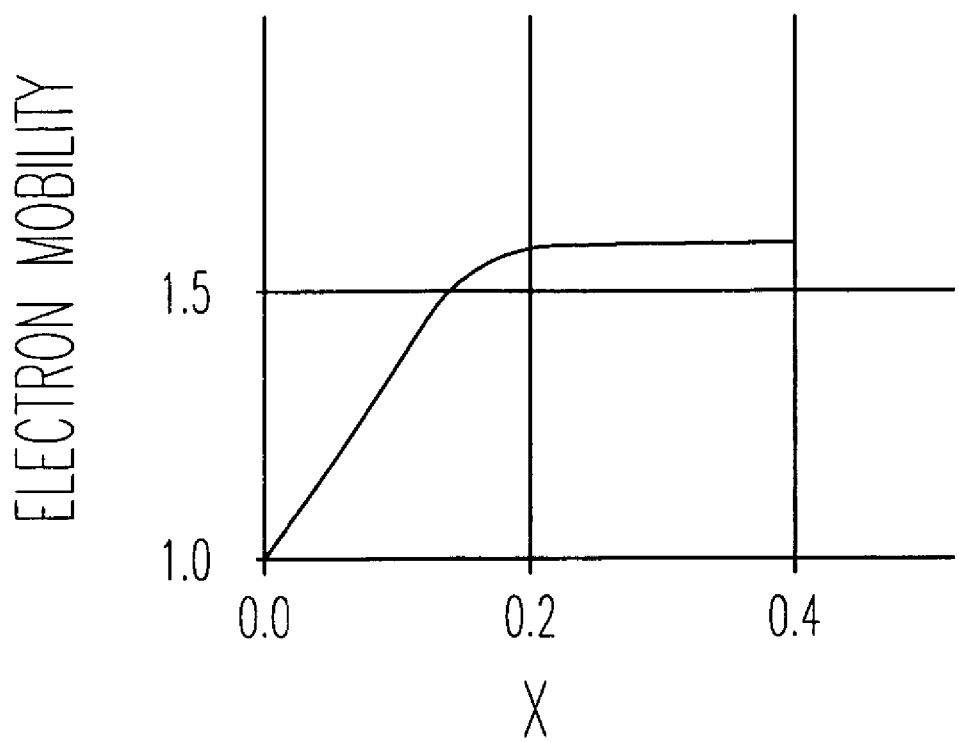
FIG. 2 illustrates the lattice constant of a silicon germanium ($Si_{1-X}Ge_X$) substrate for different percentages (X) of germanium.

FIG. 2 illustrates the mobility enhancement for strained Si for different percentages (X) of Ge in a $Si_{1-X}Ge_X$ substrate. The mobility enhancement increases as the percentage of Ge in the $Si_{1-X}Ge_X$ increases, and levels off to around 1.6 when the percentage of Ge is around 22% or larger. Referring to FIG. 1, 22% Ge provides the $Si_{1-X}Ge_X$ substrate with a lattice constant ($SiGe_{LC}$) of around 5.485. Using Equation 1, it is determined that the corresponding strain for 22% Ge (the approximate point where the mobility enhancement levels off) is about 1%.

When the percentage of Ge in the $Si_{1-X}Ge_X$ is about 20% (near the knee of the curve), it can be calculated that the resulting strain is about 0.75%. When the percentage of Ge in the $Si_{1-X}Ge_X$ is about 40%, it can be calculated that the resulting strain is about 1.5%. Referring again to FIG. 1, it can be seen that a $Si_{1-X}Ge_X$ substrate having just under 10% Ge still provides considerable mobility enhancement (1.3). A $Si_{1-X}Ge_X$ substrate having just under 10% Ge provides the $Si_{1-X}Ge_X$ substrate with a lattice constant ($SiGe_{LC}$) of around 5.457. Using Equation 1, it is determined that the corresponding strain is around 0.5%. Thus, it is desirable to achieve a biaxial strain around or greater than 0.5%, and preferably around 1% or greater to obtain the desired enhanced mobility associated with strained Si.

Figure 3:
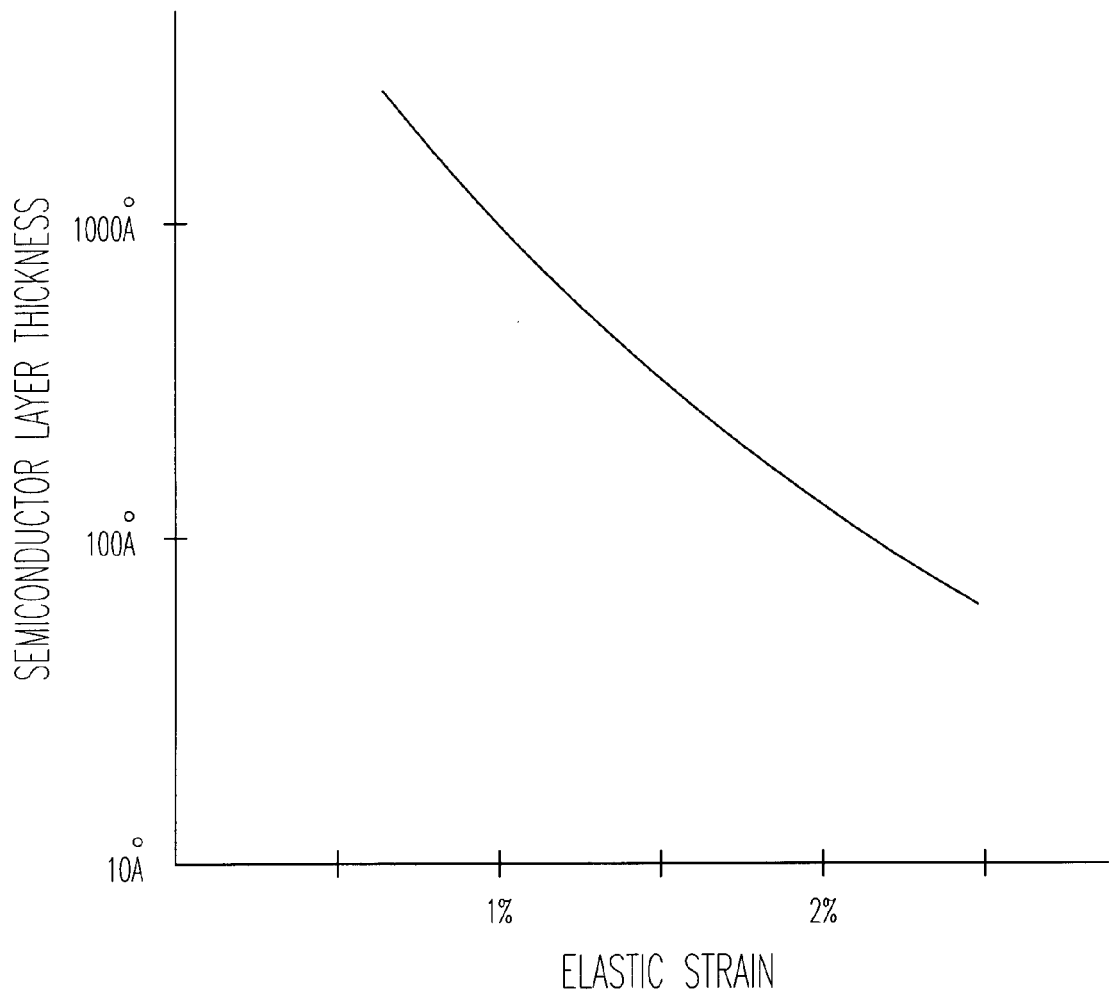
FIG. 3 illustrates the mobility enhancement for strained silicon for different percentages (X) of germanium in a silicon germanium ($Si_{1-X}Ge_X$) substrate.

A strain is mechanically induced in thin semiconductor layers. FIG. 3 illustrates a relationship between elastic strain and semiconductor layer thicknesses. The semiconductor yield is plotted with respect to plastic deformation and defects in bulk samples. The illustrated values represent the relationship of thin SiGe layers on silicon. FIG. 3 illustrates that thin layers of silicon or other semiconductor materials are more tolerant of strain than thick bulk samples. Previously, thin layers of SiGe have been fabricated on silicon because of the tolerance of the thin layers to strain. FIG. 3 indicates that 1000 Å thin semiconductor layers can be strained up to about 1%, that 100 Å thin semiconductor layers can be strained up to about 2% and thinner semiconductor layers can be strained up to about 2.5%. However, as illustrated earlier with respect to FIG. 2, the mobility enhancement levels off when the strain reaches about 1%.

It is thus desirable to strain a thin semiconductor layer, such as a silicon layer, with a strain greater than 0.5% to achieve significant mobility enhancement. It is desirable to strain a thin semiconductor layer, such as an ultra-thin silicon layer approximately 100 Å or less, with a strain within a range of approximately 0.75% to approximately 1.5% where the mobility enhancement levels off. It is also desirable to reduce unnecessary strain and provide a margin for error without unduly affecting the mobility enhancement. Thus, it is desirable to strain a thin semiconductor layer, such as a thin silicon layer, with a strain in the range of approximately 1% to approximately 1.2%.

A thin silicon film is strained by bonding the thin silicon film on a silicon substrate with a predetermined misorientation. In various embodiments, the predetermined misorientation is a predetermined tilt and/or twist misorientation. Twist-bonding has been explored in wafer bonding research, where it is known that a lattice-mismatch between an epitaxial layer and the substrate material causes structural defects when a film is grown to a certain thickness. The film grows pseudomorphically until dislocations form to accommodate the strain energy. Thus, misorientation during wafer bonding can cause a stress that results in plastic deformation. The stress associated with the misorientation causes dislocations to be created, and/or causes the bonded material to yield. It has been proposed in literature to twist-bond a thin crystalline membrane onto a crystalline substrate to form a structure that has been identified in literature as a "compliant substrate," a "universal substrate," and a "compliant universal substrate." These substrates involve twist-bonding a crystallized membrane (such as GaAs) onto a crystallized substrate (such as GaAs). The membrane is rotated with respect to and wafer-fused to the substrate such that the crystals of the membrane and the substrate are not orientated. A dense network of screw dislocations are formed in the membrane to bond the thin membrane to the substrate. This dense network is formed as a regular array of small islands that twist into alignment with and firmly bond to the substrate. Flexible distorted regions are formed between the regular array of islands (screw dislocations). These flexible distorted regions between the screw dislocations are not securely bonded to the substrate, and form a spring-like flexible layer capable of absorbing lattice mismatches. Thus, when a lattice mismatched epitaxial layer is grown on the membrane, the membrane deforms elastically to accommodate the strained energy to prevent misfit dislocations in the epitaxial layer. It is known from experience with Si/SiGe structures that thin films are able to be significantly strained before plastic deformation or yield. Thus, thin films of GaAs have been previously described for producing compliant universal substrate.

A thin silicon film is bonded on a silicon substrate with a predetermined misorientation (tilt and/or twist) to produce a sufficient strain for mobility enhancement without causing dislocations, plastic deformation, yield and/or fracture. A bond between a crystalline membrane and a crystalline substrate is designed with two or more strong body regions that are separated by a weak bonding region. The strong bonding regions include a regular array of screw dislocations. The membrane in the weak bonding region has a desired strain. Various embodiments of the present invention provide biaxial-strained silicon and various embodiments provide uniaxial-strained silicon.

Figure 4:
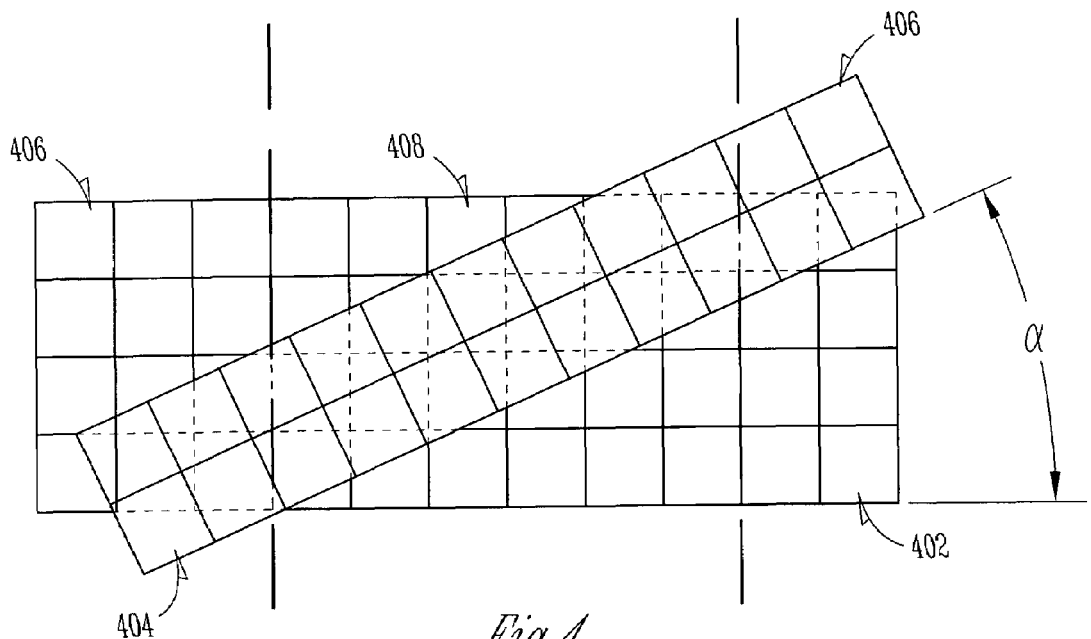
FIG. 4 illustrates bonding of a thin semiconductor film with respect to a substrate at a predetermined misorientation, according to various embodiments of the present invention.

FIG. 4 illustrates bonding of a thin semiconductor film with respect to a substrate at a predetermined misorientation, according to various embodiments of the present invention. The figure illustrates a crystalline semiconductor substrate 402, such as a crystalline semiconductor substrate, and further illustrates a crystalline thin semiconductor film 404, layer or membrane, such as a crystalline silicon membrane. The membrane 404 is oriented to the substrate 402 at an angle α, and is bonded to the substrate. Due to the crystalline nature of the membrane 404 and the substrate 402, the crystal orientation of the membrane is considered to be misorientated with the crystal orientation of the substrate. This misorientation is intentional, and as is described below, is chosen to provide a desired strain in the membrane.

The membrane and the substrate are defined to have strong bonding regions 406 and a weak bonding region 408 between the strong bonding regions. The nomenclature for these regions 406 and 408 characterize a bonding interface between the membrane 404 and the substrate 402. In various embodiments, the membrane and the substrate are appropriately prepared to provide an oxide-free bonding interface between the membrane and the substrate in the strong bonding regions 406 to provide a stronger bond. In various embodiments, the membrane and the substrate are appropriately prepared to provide an oxide in the bonding interface between the membrane and the substrate in the weak bonding region 408 to provide a weaker bond. One of ordinary skill in the art will appreciate, upon reading and comprehending this disclosure, that these preparations may only require preparing one of the membrane 404 and the substrate 402. The strong bonding regions 406 have a regular array of screw dislocations that bond the membrane to the substrate. The membrane 404 is strained in the weak bonding region 408. A desired strain is achieved by controlling the misorientation angle α.

Thinner semiconductor layers are capable of being under greater strain before yielding. The semiconductor membrane has a thickness such that it does not yield under a desired strain achieved by bonding the membrane to the substrate at a desired misorientation angle. In various embodiments, the semiconductor membrane is ultra thin. In various embodiments, the semiconductor membrane is approximately 1000 Å or less. In various embodiments, the semiconductor membrane is approximately 100 Å or less.

One process for forming the membrane 404 involves a bond cut process to form a surface silicon layer from a sacrificial wafer, and bond the surface silicon layer to a silicon substrate in a manner to provide the desired twist and/or tilt orientation between the crystalline structure in the surface layer and the crystalline structure in the substrate. The bond cut process has been referred to in various literature as a "smart-cut process."

FIGS. 5A–5D illustrate a method to form a strained semiconductor membrane using a bond cut process, according to various embodiments of the present invention. The bond cut process involves bonding together two substrates, or wafers, and breaking off a section of at least one of the two substrate after the substrates have been bonded together.

Figure 5A:
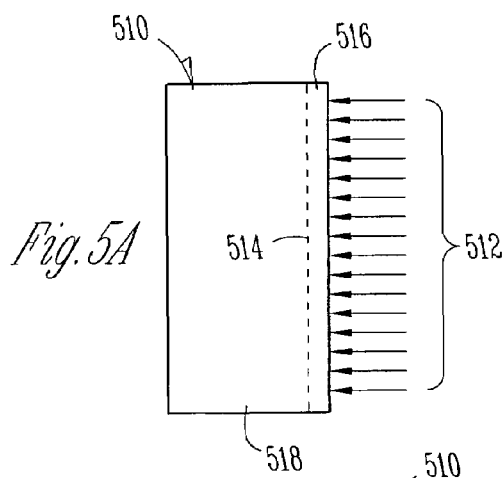
FIGS. 5A–5D illustrate a method to form a strained semiconductor membrane using a bond cut process, according to various embodiments of the present invention.
Figure 5B:
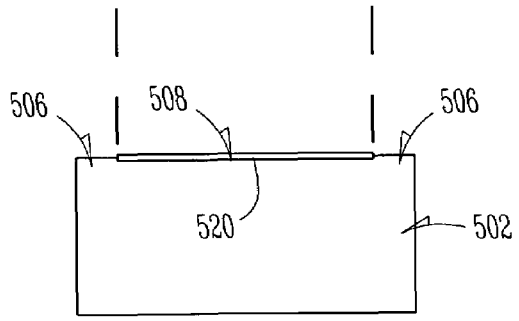

FIG. 5A illustrates a sacrificial semiconductor wafer 510, and FIG. 5B illustrates a semiconductor substrate 502. The substrate 502 includes a semiconductor material. In various embodiments, the semiconductor material includes one of the following materials: silicon; germanium; silicon-germanium; gallium arsenide; indium phosphide; and other semiconductor materials. This list of potential semiconductor materials is not intended to be an all-inclusive list. The silicon substrate is cut into wafer size patterns, and integrated circuits are formed thereon. In various embodiments, the sacrificial wafer includes various semiconductor material including but not limited to silicon, germanium, silicon-germanium, gallium arsenide, indium phosphide, and other semiconductor materials.

Figure 5C:
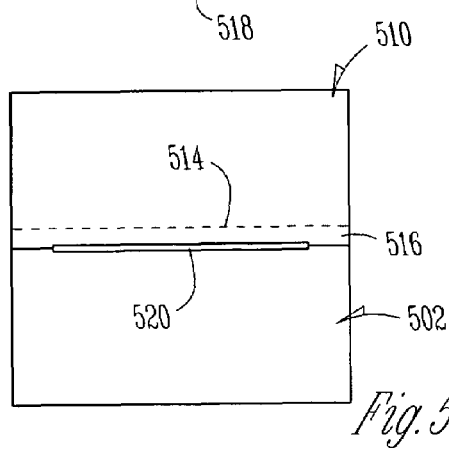
Figure 5D:
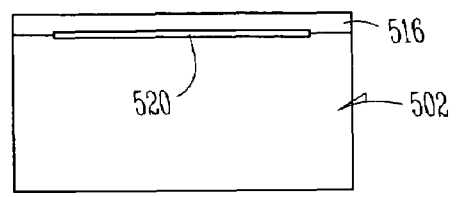

The sacrificial wafer 510 is a single crystal wafer, and is conditioned by implanting ions 512 into a surface. The ions are implanted along a plane, represented in FIG. 6 as a line 514, to define a surface layer 516 with a predetermined thickness. The plane is approximately parallel to the surface in which the ions are implanted. In various embodiments, hydrogen ions are used as implantation ions. The hydrogen ions can include $H^+$, $H_2^+$, $D^+$, and/or $D_2^+$ ions. The implanted ions act 512 to form cavities along the plane 514. The cavities are joined through thermal processing, allowing the surface layer 516 to be removed from the remaining portion of the sacrificial wafer 518 at the cleavage plane 514. In various embodiments, this thermal processing occurs while the surface layer 516 is being bonded to the substrate 502, as shown in FIG. 5C. Once these cavities join and the surface layer is bonded to the substrate, the surface layer breaks off of the sacrificial wafer at the cleavage plane and remains bonded to the substrate. The remaining portion of the sacrificial wafer 518 can be used to form membranes for other substrates, thus reducing waste the overall cost for the manufacturing process of a wide variety of electronic devices.

At least one of the membrane and the substrate are prepared to define strong and weak bond regions 506 and 508, respectively. FIG. 5B illustrates an oxide 520 on the substrate 502 where it is desired to weakly bond the membrane to the substrate. The strong bonding regions are oxide-free to provide strongly bond the interface of the membrane to the substrate. One of ordinary skill in the art will understand, upon reading and comprehending this disclosure, that there are a number of ways to define strong and weak bonding regions on the substrate 502 and/or on the surface layer 516.

FIG. 5C illustrates the surface layer 516 of the sacrificial wafer 510 bonded to the substrate 502. Before the surface layer is bonded to the substrate, the sacrificial wafer and the substrate can be cleaned using conventional cleaning procedures. In various embodiments, the bonding force includes the strong Van der Waal's force that naturally bonds surfaces together as the bonding force. In various embodiments, the Van der Waal's force provides an initial bonding force that is strengthened during subsequent thermal processing.

The bonded wafers are heated to further bond the surface layer to the substrate and to cut the surface layer 516 from the sacrificial wafer 510. Heating the sacrificial wafer joins the cavities in the cleavage plane, allowing the remaining portion of the sacrificial wafer to be removed from the surface layer, which remains bonded to the substrate. The remaining portion of the sacrificial wafer can be prepared and conditioned for another bond cut process.

The thickness of the silicon layer 516 bonded to the substrate 502 is defined by the depth of ion implantation 512 during the bond cut process. In various embodiments, the thickness of the silicon layer is such that it does not yield or otherwise plastically deform under the desired mechanical strained induced by the twist/tilt bond. In various embodiments, the silicon layer has a thickness of about 0.1 microns (100 nm or 1000 Å). In various embodiments, the silicon layer has a thickness less than 0.1 microns. In various embodiments, the silicon layer has a thickness of around 100 Å or less.

In various embodiments, the silicon film is prepared for transistor fabrication. In various embodiments, the preparation of the film includes chemical and/or mechanical polishing. Thus, the membrane bonded to the substrate illustrated in FIG. 5D can be thinner than the surface layer defined in the sacrificial layer in FIG. 5A. Device processing can be accomplished using conventional processes and procedures.

Figure 6A:
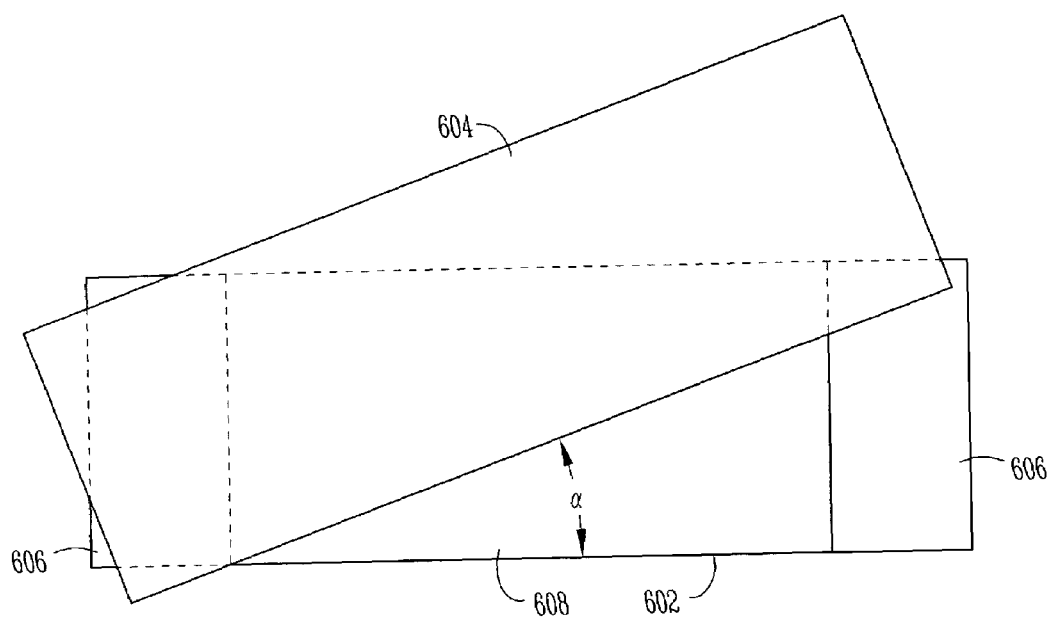
FIGS. 6A–6B illustrate a method to biaxially strain a semiconductor membrane by bonding the membrane to the substrate at a predetermined twist misorientation, according to various embodiments of the present invention.
Figure 6B:
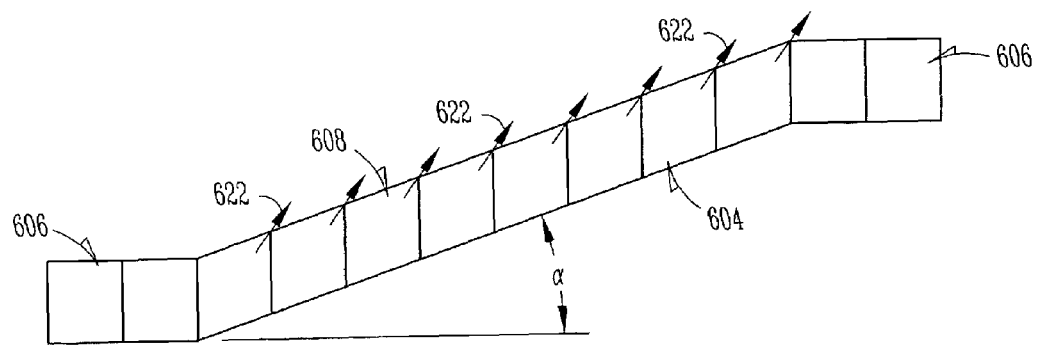

FIGS. 6A–6B illustrate a method to biaxially strain a semiconductor membrane by bonding the membrane to the substrate at a predetermined twist misorientation, according to various embodiments of the present invention. The figure illustrates a top view of a silicon membrane 604 bonded to a silicon substrate 602 with a predetermined twist misorientation. The misorientation angle a is along the plane where the membrane 604 interfaces with the substrate 602. The present invention is applicable to semiconductor material other than silicon.

Strong bonding regions 606 are provided, and a weak boding region 608 is provided between the strong bonding regions 606. The membrane 604, or thin film, is pinned to the substrate in the strong bonding regions. These strong bonding regions are made free of an oxide. The weak bonding region between the pinned regions where the film will be strained is left with a thin oxide or native oxide, or otherwise is provided with an oxide, to provide a low bonding strength.

FIG. 6B is a top view of the membrane that is pinned to the substrate in the strong bonding regions. The membrane in the weak bonding region has a biaxial strain, as indicated by the arrows 622.

Figure 7A:
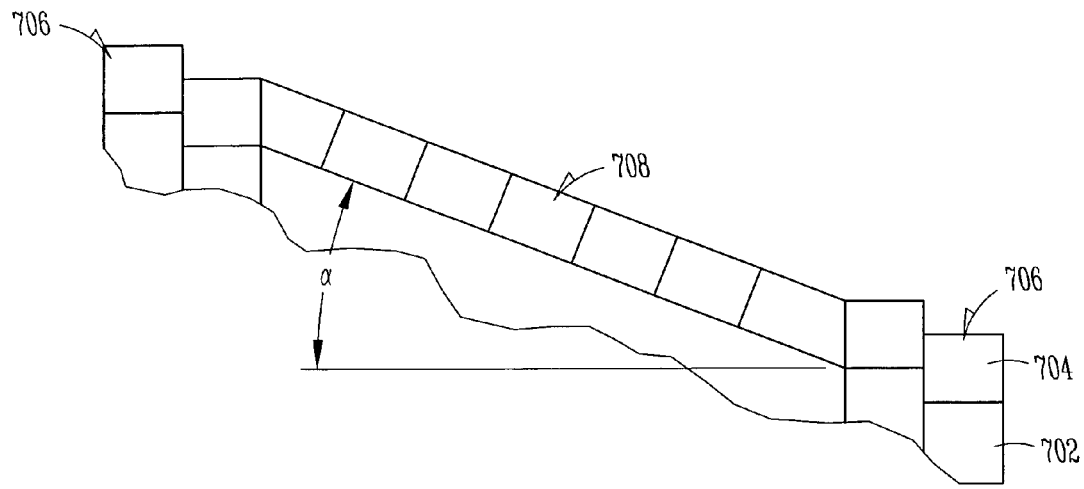
FIGS. 7A–7B illustrate a method to uniaxially strain a semiconductor membrane by bonding the membrane to the substrate at a predetermined tilt misorientation, according to various embodiments of the present invention.
Figure 7B:
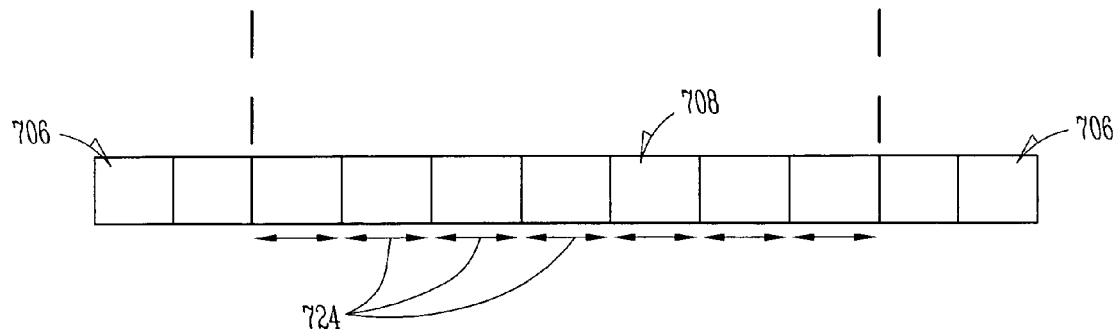

FIGS. 7A–7B illustrate a method to uniaxially strain a semiconductor membrane by bonding the membrane to the substrate at a predetermined tilt misorientation, according to various embodiments of the present invention. FIG. 7A illustrates a side view of a silicon membrane 704 bonded to a silicon substrate 702 with a predetermined tilt orientation. The misorientation angle α is vertical with respect to a flat wafer surface. Again, the present invention is applicable to semiconductor material other than silicon.

FIG. 7B illustrates a top view of the silicon layer. The silicon is uniaxially strained if the misorientation is attributed to a tilt misorientation. Strong bonding regions 706 are provided, and a weak bonding region 708 is provided between the strong bonding regions. The membrane 704, or thin film, is pinned to the substrate 702 in the strong bonding regions 706. These strong bonding regions are made free of an oxide. The weak bonding region 708 between the pinned regions where the film will be strained is left with a thin oxide or native oxide, or otherwise is provided with an oxide, to provide a low bonding strength. The membrane 704 in the weak bonding region 708 has a uniaxial strain, as indicated by the arrows 724.

Less strain is required to obtain an improvement factor if the silicon is strained uniaxially rather than biaxially. Uniaxial strained silicon reduces band gap and in-plane effective mass to improve conduction, reduces contact potentials, and alters the work function.

Figure 8:
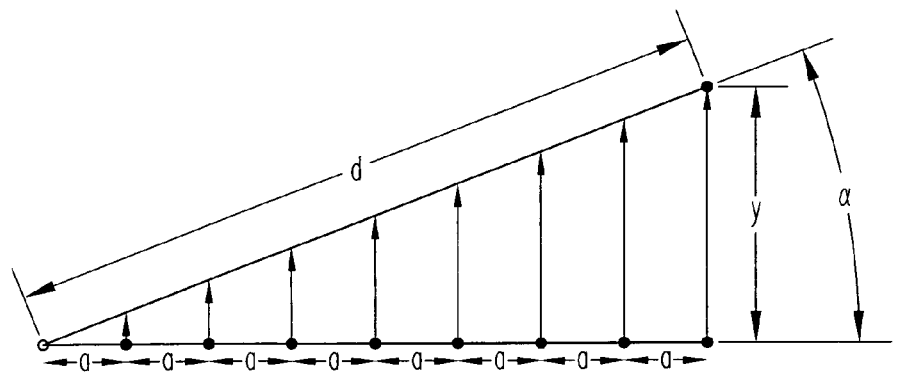
FIG. 8 illustrates a misorientation angle (α) for crystalline semiconductor cells having a length (a) for use to determine a strain associated with the misorientation.

FIG. 8 illustrates a misorientation angle (α) for crystalline semiconductor cells having a length (a) for use to determine a strain associated with the misorientation. The figure illustrates a calculation of the amount of strain as a function of a twist misorientation. As is calculated below, 1.8° twist misorientation produces a 1% strain. This strain stretches the silicon bonds. A 1% strain is sufficient to produce a significant enhancement in the electron mobility. As provided earlier, a silicon strain greater than 0.5% achieves significant mobility enhancement. Various embodiments provide a strain up to about 2.5%. Various embodiments mechanically strain the silicon with a strain within a range of approximately 0.75% to approximately 1.5% where the mobility enhancement levels off. Various embodiments mechanically strain the silicon with a strain within a range of approximately 1% to approximately 1.2%.

The amount of strain the layers allow before plastic deformation and/or yielding is determined by the thickness of the film. In various embodiments, a thin silicon film is bonded to a silicon substrate. In various embodiments, the thin silicon film approximately 1000 Å (100 nm) or less. Silicon films having a thickness of approximately 1000 Å (100 nm) or less can be referred to as ultra-thin films. In various embodiments, the thin silicon film is approximately 100 Å or less.

In FIG. 8, the length of the crystalline atoms is identified as "a" and the length for a number (n) of crystalline atoms is "n·a." The length of a number of crystalline atoms increases from "n·a" to d when a crystalline membrane is bonded to a crystalline substrate with a misorientation angle α because the silicon bonds are stretched. Referring to the figure, it is determined that:

$$d = \sqrt{(n \cdot a)^2 + y^2} \ ; \quad (3)$$

and $$\tan \alpha = \frac{y}{n \cdot a}. \quad (4)$$

Thus, $$y^2 = (n \cdot a)^2 \cdot \tan^2 \alpha, \text{ and} \quad (5)$$

$$d = \sqrt{(n \cdot a)^2 + (n \cdot a)^2 \cdot (\tan^2 \alpha)}. \quad (6)$$

Equation 6 is simplified into equation 7 as follows.

$$d = (n \cdot a) \cdot \sqrt{1 + (\tan^2 \alpha)}. \quad (7)$$

If "x" is small, the following approximation (equation 8) can be made.

$$\sqrt{1 + x^2} \approx 1 + \frac{x}{2}. \quad (8)$$

Substituting into equation 7, $$d = n \cdot a \cdot \left(1 + \frac{\tan \alpha}{2}\right), \text{ or} \quad (9)$$

$$\frac{d}{n \cdot a} = 1 + \frac{\tan \alpha}{2}. \quad (10)$$

If α small, the following approximation (equation 11) can be made.

$$\tan \alpha \approx \alpha, \quad (11)$$

where α is in radians. Substituting into equation 10, $$\frac{d}{n \cdot a} = 1 + \frac{\alpha}{2}. \quad (12)$$

An estimated strain when α is 1.15°, which equals π(1.15/180) or 0.02 radians, is provided in equation 13.

$$\text{strain} = \left(1 + \frac{0.02}{2}\right) - 1 = 1\%. \quad (13)$$

Thus, the induced strain is approximately equal to one half the misorientation angle α in radians, where α is small. Thus, a 2.5% strain corresponds to a misorientation angle of 0.050 radians or 2.9°, and a 0.75% strain corresponds to a misorientation angle of 0.015 radians or 0.86°.

Figure 9:
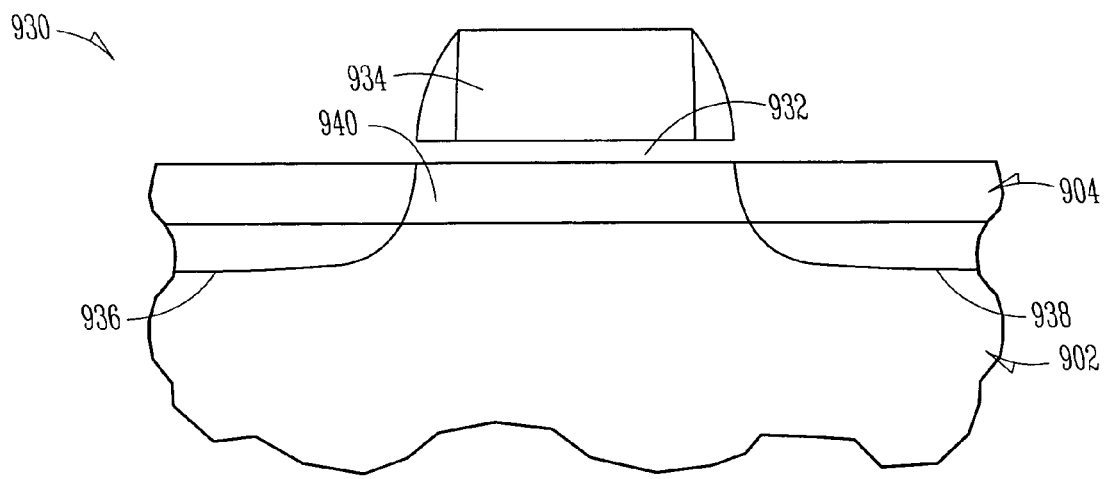
FIG. 9 illustrates a transistor fabricated with a strained semiconductor membrane, according to various embodiments of the present invention.

FIG. 9 illustrates a transistor fabricated with a strained semiconductor membrane, according to various embodiments of the present invention. The illustrated transistor 930 includes a crystalline semiconductor substrate 902, and a crystalline semiconductor membrane 904 bonded to the substrate 902 with a desired misorientation to provide the membrane 904 with a desired strain. A gate dielectric 932 is formed on the strained membrane, and a gate 934 is formed on the gate dielectric 932. First and second diffusion regions 936 and 938 are formed in the structure. A channel region 940 is formed in the strained semiconductor membrane 904 between the first and second diffusion regions 936 and 938.

Figure 10:
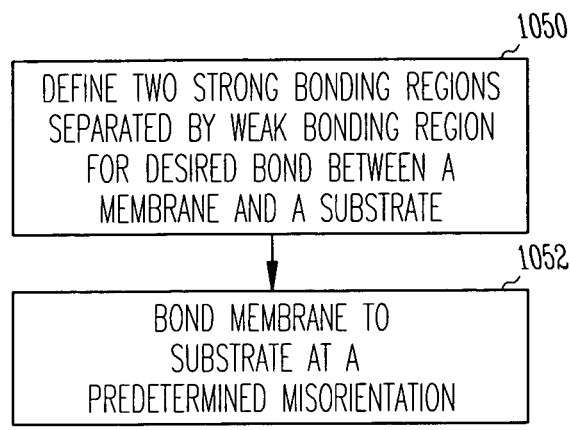
FIG. 10 illustrates a method for forming a strained semiconductor structure, according to various embodiments of the present invention.

FIG. 10 illustrates a method for forming a strained semiconductor structure, according to various embodiments of the present invention. In various embodiments, at least two strong bonding regions are defined at 1050 for a desired bond between a crystalline semiconductor membrane and a crystalline semiconductor substrate. The strong bonding regions are separated by a weak bonding region. The membrane is bonded to the substrate at a predetermined misorientation at 1052. The membrane is pinned to the substrate at the strong bonding regions by a regular array of screw dislocations. The membrane is strained in the weak bonding region. The strain corresponds to the misorientation angle of the membrane bonded to the substrate.

Figure 11:
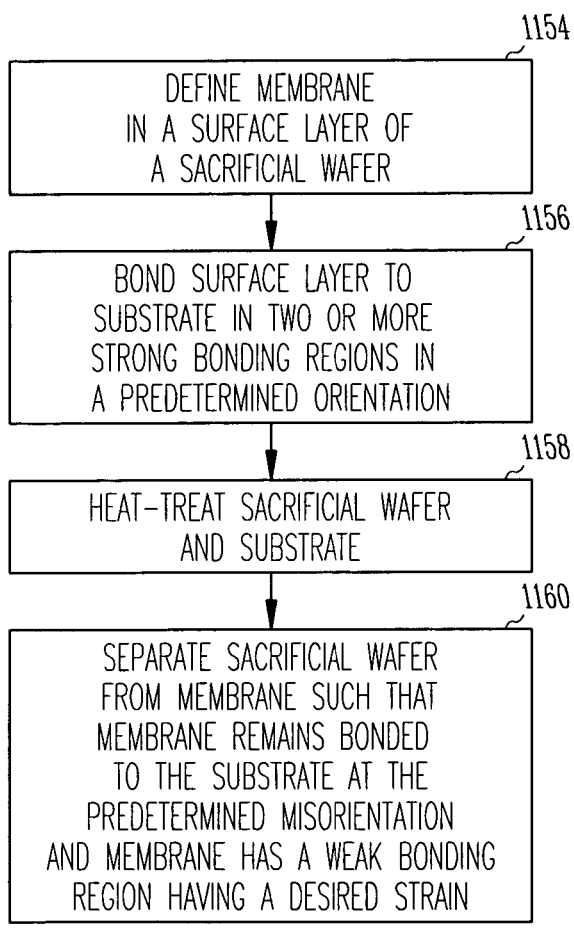
FIG. 11 illustrates a method for forming a strained semiconductor structure using a bond cut process, according to various embodiments of the present invention.

FIG. 11 illustrates a method for forming a strained semiconductor structure using a bond cut process, according to various embodiments of the present invention. At 1154, a membrane is defined in a surface layer of a sacrificial wafer. The membrane is defined by implanting ions into the surface layer of the sacrificial wafer to form cavities along a cleavage plane in the sacrificial wafer. At 1156, the surface layer of the sacrificial wafer is bonded to a substrate at two or more strong bonding regions in a predetermined misorientation. The naturally occurring Van der Waal's force provides an initial bonding force. At 1158, the sacrificial wafer and the substrate is heat treated. This heat-treating process further bonds the surface layer of the sacrificial wafer to the substrate, and joins the cavities along the cleavage plane. At 1160, the sacrificial wafer (or the remaining portions thereof) is removed from the membrane with the membrane left bonded to the substrate at the predetermined misorientation. The membrane has a desired strain in a weak bonding region positioned between strong bonding regions.

Figure 12:
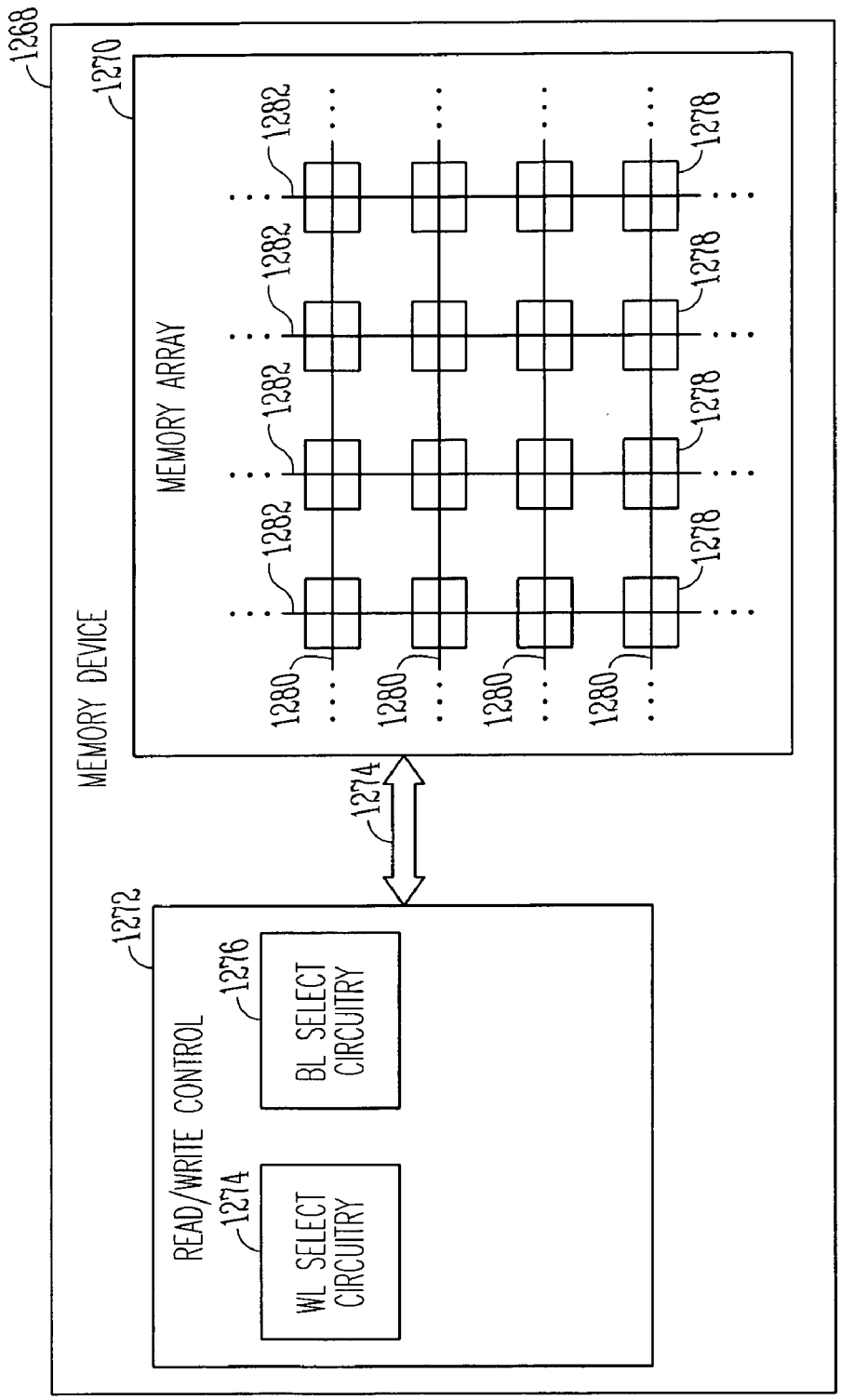
FIG. 12 is a simplified block diagram of a high-level organization of various embodiments of a memory device according to various embodiments of the present invention.

FIG. 12 is a simplified block diagram of a high-level organization of various embodiments of a memory device according to various embodiments of the present invention. The illustrated memory device 1268 includes a memory array 1270 and read/write control circuitry 1272 to perform operations on the memory array via communication line(s) 1274. The illustrated memory device 1268 may be a memory card or a memory module such as a single inline memory module (SIMM) and dual inline memory module (DIMM). One of ordinary skill in the art will understand, upon reading and comprehending this disclosure, that semiconductor components in the memory array 1270 and/or the control circuitry 1272 are able to be fabricated using the strained semiconductor films, as described above. For example, in various embodiments, the memory array 1270 and/or the control circuitry 1272 include transistors with strained body layers formed using a strained silicon on silicon germanium (Si/SiGe) structure. The structure and fabrication methods for these strained body layers have been described above.

The memory array 1270 includes a number of memory cells 1278. The memory cells in the array are arranged in rows and columns. In various embodiments, word lines 1280 connect the memory cells in the rows, and bit lines 1282 connect the memory cells in the columns. The read/write control circuitry 1272 includes word line select circuitry 1274, which functions to select a desired row. The read/write control circuitry 1272 further includes bit line select circuitry 1276, which functions to select a desired column.

Figure 13:
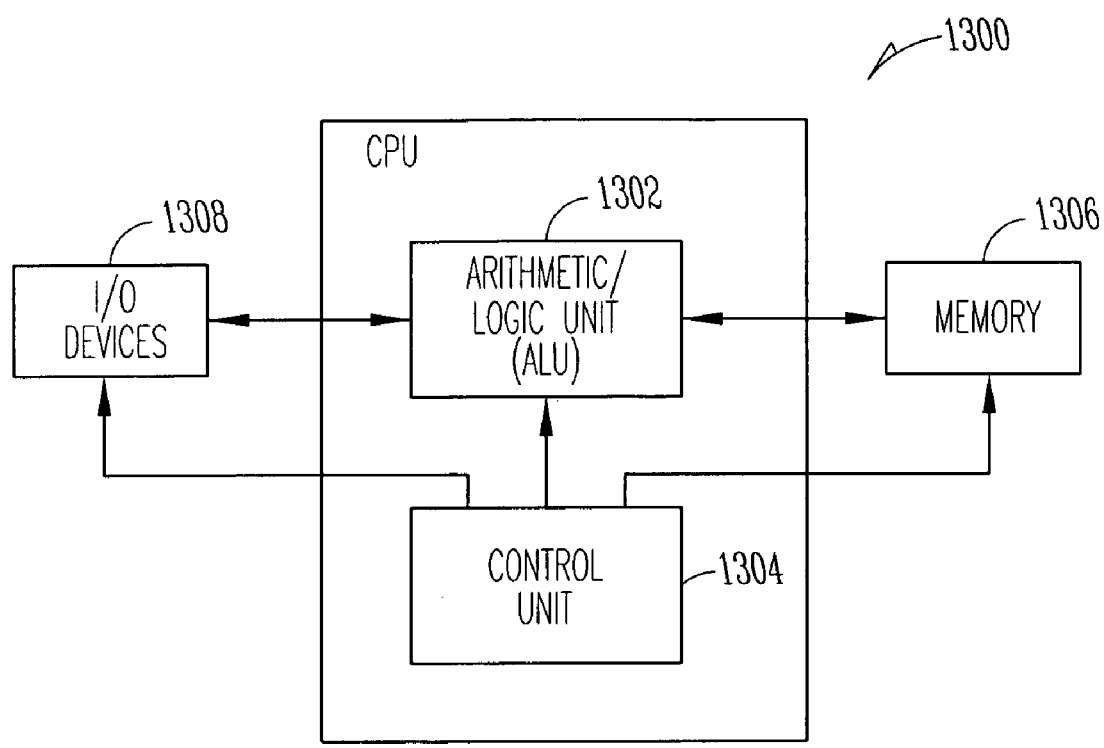
FIG. 13 is a simplified block diagram of a high-level organization of various embodiments of an electronic system according to the present invention.

FIG. 13 is a simplified block diagram of a high-level organization of various embodiments of an electronic system according to the present invention. In various embodiments, the system 1300 is a computer system, a process control system or other system that employs a processor and associated memory. The electronic system 1300 has functional elements, including a processor or arithmetic/logic unit (ALU) 1302, a control unit 1304, a memory device unit 1306 (such as illustrated in FIG. 12) and an input/output (I/O) device 1308. Generally such an electronic system 1300 will have a native set of instructions that specify operations to be performed on data by the processor 1302 and other interactions between the processor 1302, the memory device unit 1306 and the I/O devices 1308. The control unit 1304 coordinates all operations of the processor 1302, the memory device 1306 and the I/O devices 1308 by continuously cycling through a set of operations that cause instructions to be fetched from the memory device 1306 and executed. According to various embodiments, the memory device 1306 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include strained silicon on silicon germanium (Si/SiGe) in accordance with the present invention.

The illustration of the system 1300 is intended to provide a general understanding of one application for the structure and circuitry of the present invention, and is not intended to serve as a complete description of all the elements and features of an electronic system using strained semiconductor films according to the present invention. As one of ordinary skill in the art will understand, such an electronic system can be fabricated in single-package processing units, or even on a single semiconductor chip, in order to reduce the communication time between the processor and the memory device.

Applications containing strained semiconductor films, such as transistors with a strained semiconductor body layer, as described in this disclosure include electronic systems for use in memory modules, device drivers, power modules, communication modems, processor modules, and application-specific modules, and may include multilayer, multichip modules. Such circuitry can further be a subcomponent of a variety of electronic systems.

CONCLUSION

The present invention provides strained semiconductor layers by bonding, or wafer bonding, a crystalline semiconductor membrane to a crystalline semiconductor substrate at a predetermined misorientation. The membrane is strongly bonded to the substrate in at least two strong bonding regions and is weakly bonded to the substrate in a weak bonding region between the strong bonding regions. The membrane in the weak bonding region has a strain attributable to the misorientation. A regular array of screw dislocations bonds the membrane to the substrate in the strong bonding regions. In various embodiments, an interface between the membrane and the substrate is free of an oxide in the strong bonding regions, and includes an oxide, such as a thin oxide or native oxide, in the weak bonding regions.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present invention. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A strained semiconductor structure, comprising:
a crystalline semiconductor substrate; and
a crystalline semiconductor membrane bonded to the substrate at a predetermined misorientation, the membrane being strongly bonded to the substrate in at least two predetermined strong bonding regions and weakly bonded to the substrate in a weak bonding region located between the strong bonding regions, wherein the predetermined misorientation provides the membrane with a predetermined strain in between the strong bonding regions.

2. The structure of claim 1, wherein the membrane includes a regular array of screw dislocations in the strong bonding regions.

3. The structure of claim 1, wherein an interface between the substrate and the membrane is free of an oxide in the predetermined strong bonding regions.

4. The structure of claim 1, wherein an interface between the substrate and the membrane includes an oxide to weaken a bond between the membrane and the substrate.

5. The structure of claim 1, wherein the predetermined misorientation provides the membrane with a predetermined strain greater than 0.5%.

6. The structure of claim 1, wherein the predetermined misorientation provides the membrane with a predetermined strain within a range between approximately 0.75% and approximately 1.5%.

7. The structure of claim 1, wherein the predetermined misorientation provides the membrane with a predetermined strain within a range between approximately 1.0% and approximately 1.2%.

8. The structure of claim 1, wherein the predetermined misorientation is in a range of approximate 0.86° to approximately 2.9°.

9. The structure of claim 1, wherein the membrane has a predetermined thickness of 1000 Å or less.

10. A strained semiconductor structure, comprising:
a crystalline silicon substrate; and
a crystalline silicon membrane strongly bonded to the substrate in at least two predetermined strong bonding regions and weakly bonded to the substrate in a weak bonding region located between the strong bonding regions, wherein the membrane is strained in between the strong bonding regions.

11. The structure of claim 10, wherein the membrane includes a regular array of screw dislocations in the strong bonding regions.

12. The structure of claim 10, wherein an interface between the substrate and the membrane is free of an oxide in the predetermined strong bonding regions.

13. The structure of claim 10, wherein an interface between the substrate and the membrane includes an oxide to weaken a bond between the membrane and the substrate.

14. The structure of claim 10, wherein the predetermined misorientation provides the membrane with a predetermined strain greater than 0.5%.

15. A strained semiconductor structure, comprising:
a crystalline silicon substrate; and
a crystalline silicon membrane strongly bonded to the substrate in at least two predetermined strong bonding regions and weakly bonded to the substrate in a weak bonding region located between the strong bonding regions, the membrane being bonded to the substrate at a predetermined twist misorientation, wherein the membrane in the weak bonding region has a biaxial strain.

16. The structure of claim 15, wherein the membrane includes a regular array of screw dislocations in the strong bonding regions.

17. The structure of claim 15, wherein an interface between the substrate and the membrane is free of an oxide in the predetermined strong bonding regions.

18. The structure of claim 15, wherein an interface between the substrate and the membrane includes an oxide to weaken a bond between the membrane and the substrate.

19. The structure of claim 15, wherein the predetermined misorientation provides the membrane with a predetermined strain greater than 0.5%.

20. A strained semiconductor structure, comprising:
a crystalline silicon substrate; and
a crystalline silicon membrane strongly bonded to the substrate in at least two predetermined strong bonding regions and weakly bonded to the substrate in a weak bonding region located between the strong bonding regions, the membrane being bonded to the substrate at a predetermined tilt misorientation, wherein the membrane in the weak bonding region has a uniaxial strain.

21. The structure of claim 20, wherein the membrane includes a regular array of screw dislocations in the strong bonding regions.

22. The structure of claim 20, wherein an interface between the substrate and the membrane is free of an oxide in the predetermined strong bonding regions.

23. The structure of claim 20, wherein an interface between the substrate and the membrane includes an oxide to weaken a bond between the membrane and the substrate.

24. The structure of claim 20, wherein the predetermined misorientation provides the membrane with a predetermined strain greater than 0.5%.

25. A strained semiconductor device, comprising:
a crystalline semiconductor substrate;
a crystalline semiconductor membrane strongly bonded to the substrate in at least two predetermined strong bonding regions and weakly bonded to the substrate in a weak bonding region between the strong bonding regions, the membrane being bonded to the substrate at a predetermined misorientation, wherein the membrane has a strain in the weak bonding region; and
a channel region between a first diffusion region and a second diffusion region, the channel region being positioned in the weak bonding region of the membrane.

26. The device of claim 25, wherein the substrate includes a crystalline silicon substrate and the membrane includes a crystalline silicon membrane.

27. The device of claim 25, wherein the membrane is bonded to the substrate at a predetermined twist misorientation such that the membrane has a biaxial strain in the weak bonding region.

28. The device of claim 25, wherein the membrane is bonded to the substrate at a predetermined tilt misorientation such that the membrane has a uniaxial strain in the weak bonding region.

29. The device of claim 25, wherein the membrane has a thickness of approximately 1000 Å or less.

30. A transistor, comprising:

a crystalline silicon substrate;

a crystalline silicon layer strongly bonded to the substrate in at least two predetermined strong bonding regions and weakly bonded to the substrate in a weak bonding region between the strong bonding regions, wherein the silicon layer is bonded to the substrate in a predetermined misorientation to provide the silicon layer with a predetermined strain in the weak bonding region;

a channel region between a first diffusion region and a second diffusion region, the channel region being positioned in the strained silicon layer;

a gate dielectric positioned over the channel region; and a gate positioned over the gate dielectric.

31. The device of claim 30, wherein the silicon layer is bonded to the substrate at a predetermined twist misorientation such that the silicon layer has a biaxial strain in the weak bonding region.

32. The device of claim 30, wherein the silicon layer is bonded to the substrate at a predetermined tilt misorientation such that the silicon layer has a uniaxial strain in the weak bonding region.

33. The device of claim 30, wherein the silicon layer has a thickness of approximately 1000 Å or less.

* * * * *

UNITED STATES PATENT AND TRADEMARK OFFICE
CERTIFICATE OF CORRECTION

PATENT NO. : 7,084,429 B2
APPLICATION NO. : 10/931749
DATED : August 1, 2006
INVENTOR(S) : Forbes It is certified that error appears in the above-identified patent and that said Letters Patent is hereby corrected as shown below:

On the Title page, in item (73), in "Assignee", in column 1, line 1, delete "Micron," and insert -- Micron --, therefor.

On page 2, in item (56), under "U.S. Patent Documents", in column 1, line 9, delete "2003/0201469" and insert -- 2003/0201468 --, therefor.

On page 2, in item (56), under "Other Publications", in column 1, line 34, delete "SiO2" and insert -- $SiO_2$ --, therefor.

On page 2, in item (56), under "Other Publications", in column 2, line 5, after "Aug. 15" insert -- , --.

On page 2, in item (56), under "Other Publications", in column 2, line 21, after "Letters" insert -- , --.

On page 2, in item (56), under "Other Publications", in column 2, line 25, delete "Papers,," and insert -- Papers, --, therefor.

On page 2, in item (56), under "Other Publications", in column 2, line 33, delete "Si-xGex" and insert -- $Si_{1-x}Ge_x$ --, therefor.

On page 2, in item (56), under "Other Publications", in column 2, line 37, delete "GexSi1-x/Si" and insert -- $Ge_xSi_{1-x}/Si$ --, therefor.

On Sheet 1 of 10, in Fig. 1 (x-axis), line 1, delete "LATITICE" and insert -- LATTICE --, therefor.

Column 5, line 13, delete "$(SiGe_{Lc})$" and insert -- $(SiGe_{LC})$ --, therefor.

Column 8, line 58, delete "angle a" and insert -- angle $a$ --, therefor.

UNITED STATES PATENT AND TRADEMARK OFFICE
CERTIFICATE OF CORRECTION

PATENT NO. : 7,084,429 B2
APPLICATION NO. : 10/931749
DATED : August 1, 2006
INVENTOR(S) : Forbes It is certified that error appears in the above-identified patent and that said Letters Patent is hereby corrected as shown below:

Column 13, line 50, in Claim 8, delete "approximate" and insert -- approximately --, therefor.

Signed and Sealed this

Twenty-first Day of November, 2006

JON W. DUDAS
*Director of the United States Patent and Trademark Office*